(12) United States Patent
Oh et al.

(10) Patent No.: US 6,919,212 B2
(45) Date of Patent: Jul. 19, 2005

(54) METHOD FOR FABRICATING FERROELECTRIC RANDOM ACCESS MEMORY DEVICE WITH MERGED-TOP ELECTRODE-PLATELINE CAPACITOR

(75) Inventors: Sang-Hyun Oh, Ichon-shi (KR); Kyu-Hyun Bang, Ichon-shi (KR); In-Woo Jang, Ichon-shi (KR); Jin-Yong Seong, Ichon-shi (KR); Jin-Gu Kim, Ichon-shi (KR); Song-Hee Park, Ichon-shi (KR); Young-Ho Yang, Ichon-shi (KR); Kye-Nam Lee, Ichon-shi (KR); Suk-Kyoung Hong, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/741,670

(22) Filed: Dec. 18, 2003

(65) Prior Publication Data
US 2004/0266032 A1 Dec. 30, 2004

(30) Foreign Application Priority Data
Jun. 30, 2003 (KR) .............................. 10-2003-0043089

(51) Int. Cl.⁷ ............................................ H01L 21/00
(52) U.S. Cl. ..................... 438/3; 438/190; 438/238; 438/240; 438/250; 438/643; 257/295; 257/310
(58) Field of Search ........................ 438/3, 190, 238, 438/240, 250, 643, 239, 396, 393; 257/295, 310, 306, 532

(56) References Cited

U.S. PATENT DOCUMENTS

| | | | |
|---|---|---|---|
| 6,200,821 B1 | 3/2001 | Baek | |
| 6,291,292 B1 | 9/2001 | Yang | |
| 6,355,952 B1 | 3/2002 | Yamoto et al. | |
| 6,407,422 B1 | 6/2002 | Asano et al. | |
| 6,603,161 B2 | 8/2003 | Kanaya et al. | |
| 6,645,779 B2 * | 11/2003 | Hong | 438/3 |
| 6,713,808 B2 * | 3/2004 | Wang et al. | 257/310 |
| 2001/0013614 A1 * | 8/2001 | Joshi et al. | 257/295 |
| 2002/0056862 A1 * | 5/2002 | Miki et al. | 257/295 |
| 2004/0072442 A1 * | 4/2004 | Celii et al. | 438/710 |
| 2004/0101977 A1 * | 5/2004 | Celinska et al. | 438/3 |
| 2004/0113186 A1 * | 6/2004 | Karasawa et al. | 257/295 |

* cited by examiner

Primary Examiner—Matthew Smith
Assistant Examiner—B V. Keshavan
(74) Attorney, Agent, or Firm—Blakely Sokoloff Taylor & Zafman

(57) ABSTRACT

The present invention relates to a method for fabricating a ferroelectric random access memory (FeRAM) device. The method includes the steps of: forming a first inter-layer insulation layer on a substrate; forming a storage node contact connected with a partial portion of the substrate by passing through the first inter-layer insulation layer; forming a lower electrode connected to the storage node contact on the first inter-layer insulation layer; forming a second inter-layer insulation layer having a surface level lower than that of the lower electrode so that the second inter-layer insulation layer encompasses a bottom part of the lower electrode; forming an impurity diffusion barrier layer encompassing an upper part of the lower electrode on the second inter-layer insulation layer; forming a ferroelectric layer on the lower electrode and the impurity diffusion barrier layer; and forming a top electrode on the ferroelectric layer.

7 Claims, 6 Drawing Sheets

METHOD FOR FABRICATING FERROELECTRIC RANDOM ACCESS MEMORY DEVICE WITH MERGED-TOP ELECTRODE-PLATELINE CAPACITOR

FIELD OF THE INVENTION

The present invention relates to a method for fabricating a semiconductor device; and, more particularly, to a method for fabricating a ferroelectric random access memory device.

DESCRIPTION OF RELATED ARTS

Generally, in a semiconductor memory device, it has been attempted to develop a device operating a memory with a high capacitance and simultaneously capable of overcoming limitations in refresh required for a dynamic random access memory (DRAM) device by applying a ferroelectric thin layer to a ferroelectric capacitor. Such ferroelectric random access memory (FeRAM) device employing the ferroelectric thin layer is a nonvolatile memory device and has been highlighted as a next generation memory device due to its advantages of retrieving stored information even in a state of off-power and compatible operation speed with the DRAM.

Recently, a merged-top electrode-plateline structure is applied to a highly densified ferroelectric memory device.

FIG. 1 is a cross-sectional view of a FeRAM fabricated by a conventional method.

As shown, device isolation layers 12 defining an active region of a substrate 11 are formed, and junction regions 13 such as a source/drain are formed in the substrate 11. A first inter-layer insulation layer 14 is formed on the substrate 11, and a plurality of storage node contact plugs 15 each contacted to the corresponding junction region 13 by passing through the first inter-layer insulation layer 14 are formed. Then, lower electrodes 16 connected to each corresponding storage node contact 15 are formed on an upper surface of the first inter-layer insulation layer 14.

A second inter-layer insulation layer 17 having a planarized top surface encompasses the lower electrodes 16 to thereby isolate each adjacent lower electrode 16. Herein, the second inter-layer insulation layer 17 and the lower electrode 16 have the same plane level.

Next, a ferroelectric layer 18 is formed on the second inter-layer insulation layer 17 and the lower electrodes 16, and top electrodes 19 are subsequently formed on the ferroelectric layer 18. Herein, the ferroelectric layer 18 is formed entirely in a cell region, and only the top electrodes 19 are patterned to thereby complete the formation of a ferroelectric capacitor.

The ferroelectric capacitor shown in FIG. 1 has a merged-top electrode-plateline (MTP) structure, wherein the top electrode 19 serves a role of a plateline.

The second inter-layer insulation layer 17 is made of silicon oxide containing impurities such as phosphorus-silicate glass (PSG), boron-phosphorus-silicate glass (BPSG) and boron-silicate glass (BSG). However, boron (B) or phosphorus (P) contained in the second inter-layer insulation layer 17 may penetrate into the ferroelectric layer 18 during a subsequent thermal process, and thereby resulting in a problem of degrading ferroelectric characteristics.

FIG. 2 is a graph showing hysteresis loops which indicate the aforementioned problem in the degradation of ferroelectric characteristics.

As shown, compared to a hysteresis loop C2 depicting an ideal polarization characteristic of the ferroelectric capacitor, a hysteresis loop C1 shows that the polarization characteristic of the ferroelectric capacitor is degraded by an impurity contained in the second inter-layer insulation layer.

Thus, an impurity diffusion barrier layer is suggested to prevent the degradation of the ferroelectric characteristic caused by the impurity contained in the second inter-layer insulation layer.

FIGS. 3A to 3C are cross-sectional views illustrating another conventional method for fabricating a FeRAM device.

Referring to FIG. 3A, device isolation layers 22 for defining an active region are formed on a substrate 21, and junction regions 23 such as a source/drain of a transistor are formed in the substrate 21. A first inter-layer insulation layer 24 is deposited on the substrate 21 and is planarized thereafter. The first inter-layer insulation layer 24 is then etched by using a contact mask (not shown) to form storage node contact holes (not shown) exposing the junction regions 23. Afterwards, storage node contacts 25 buried into the storage node contact holes are formed, and a second inter-layer insulation layer 26 and an impurity diffusion barrier layer 27 are sequentially formed on the first inter-layer insulation layer 24. Then, the impurity diffusion barrier layer 27 and the second inter-layer insulation layer 26 are etched through a damascene process to form holes for forming lower electrodes.

Referring to FIG. 3B, a conductive layer for use in a lower electrode is deposited on the above structure including the impurity diffusion barrier layer 27 and the holes 28. Then, a chemical mechanical polishing (CMP) process is performed to lower electrodes 29 buried into the holes 28. At this time, the lower electrode 29 is made of a metal such as platinum (Pt) and iridium (Ir).

Referring to FIG. 3C, a ferroelectric layer 30 and a conductive layer for use in a top electrode are sequentially deposited on the above resulting structure including the lower electrodes 29. Then, the conductive layer is selectively etched to form top electrodes 31, thereby completing the formation of the ferroelectric capacitor.

However, it may be difficult to apply the CMP process to the metal layer including Pt or Ir used for forming the lower electrodes based on the above described second conventional method. Also, the lower electrodes need to be formed in multi-thin layers in order to prevent the storage node contacts from being oxidated during a subsequent thermal process. However, it is also difficult to form the lower electrodes in multi-thin layers. Furthermore, there may be a problem that the impurity diffusion barrier layer is damaged during the CMP process for exposing the impurity diffusion barrier layer 27.

SUMMARY OF THE INVENTION

It is, therefore, an object of the present invention to provide a method for fabricating a ferroelectric random access memory (FeRAM) device capable of preventing an impurity contained in an inter-layer insulation layer from being diffused into a ferroelectric layer of a ferroelectric capacitor formed without employing an expensive chemical mechanical polishing process.

In accordance with an aspect of the present invention, there is provided a method for fabricating a ferroelectric random access memory device, including the steps of: forming a first inter-layer insulation layer on a substrate; forming a storage node contact connected with a partial portion of the substrate by passing through the first inter-layer insulation layer; forming a lower electrode connected to the storage node contact on the first inter-layer insulation layer; forming a second inter-layer insulation layer having a surface level lower than that of the lower electrode so that the second inter-layer insulation layer encompasses a bottom part of the lower electrode; forming an impurity diffusion barrier layer encompassing an upper part of the lower electrode on the second inter-layer insulation layer; forming a ferroelectric layer on the lower electrode and the impurity diffusion barrier layer; and forming a top electrode on the ferroelectric layer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

FIGS. 4A to 4F are cross-sectional views of a ferroelectric random access memory (FeRAM) device fabricated in accordance with a preferred embodiment of the present invention.

Figure 1:
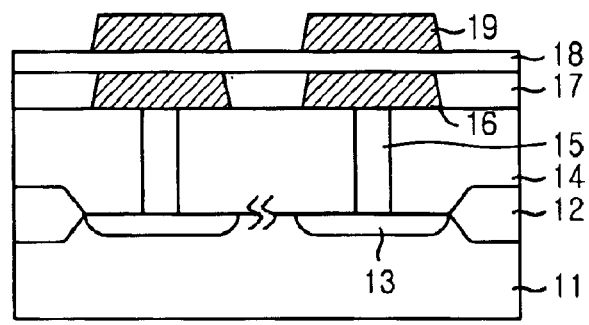
FIG. 1 is a cross-sectional view of a ferroelectric random access memory (FeRAM) device fabricated by a conventional method.
Figure 2:
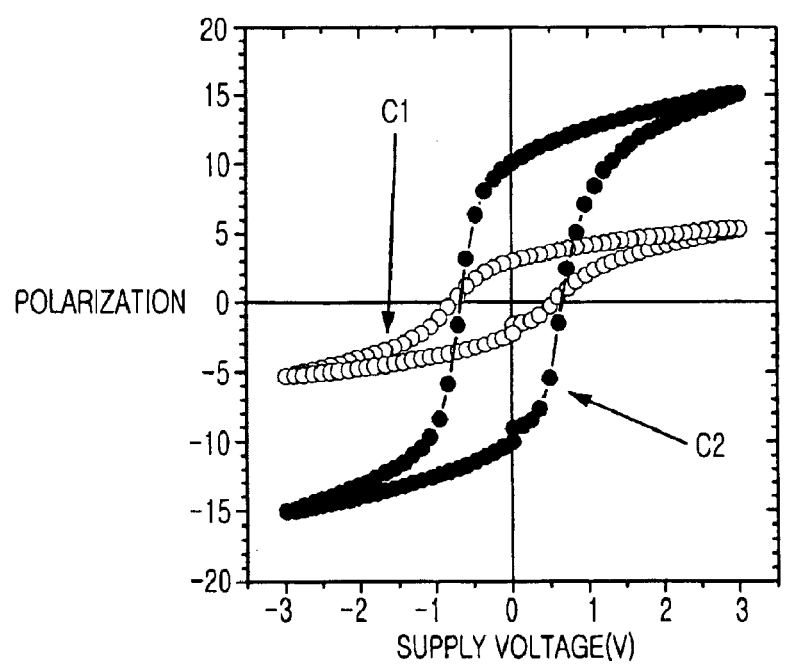
FIG. 2 is a graph of hysteresis loops illustrating a problem in degradation of ferroelectric characteristics of the FeRAM device.
Figure 3A:
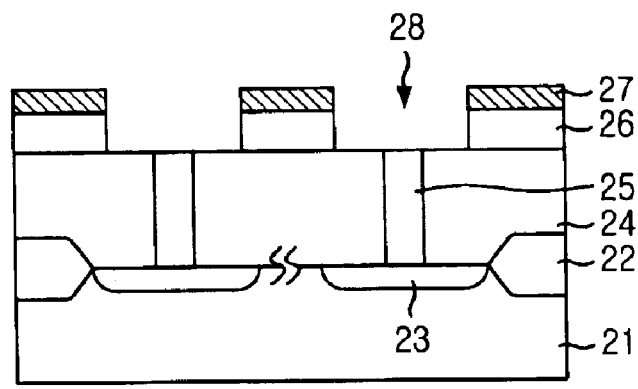
FIGS. 3A to 3C are cross-sectional views of a FeRAM device fabricated by another conventional method.
Figure 3B:
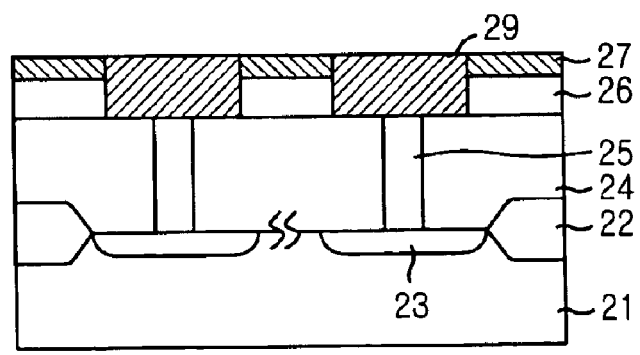
Figure 3C:
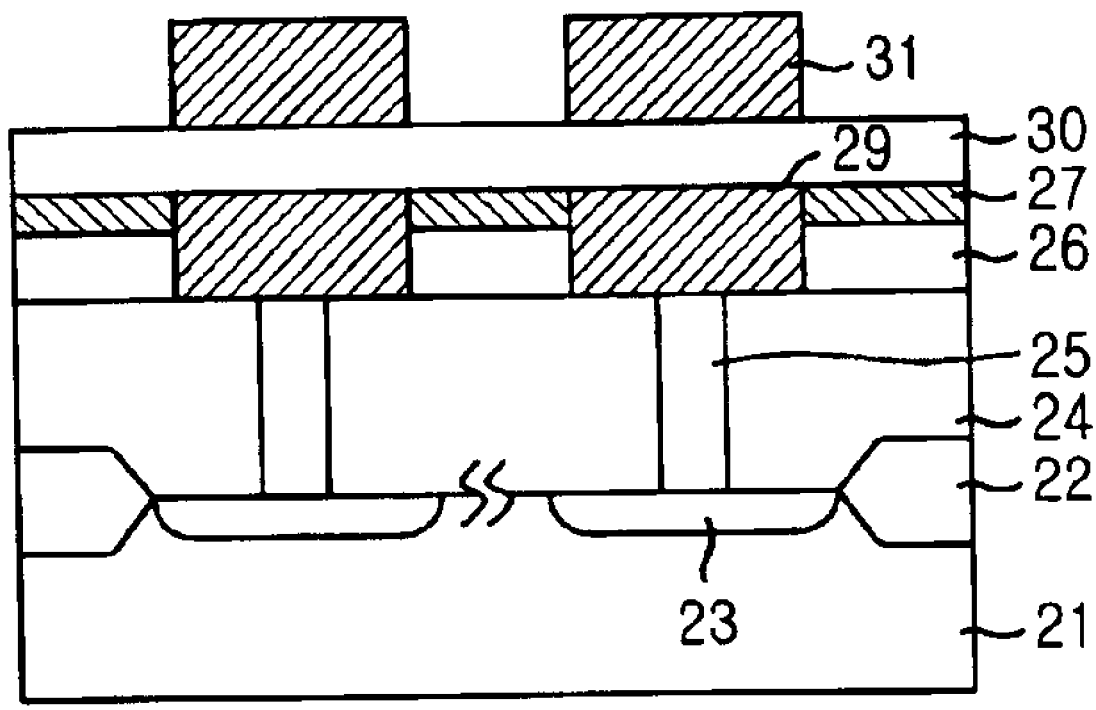
Figure 4A:
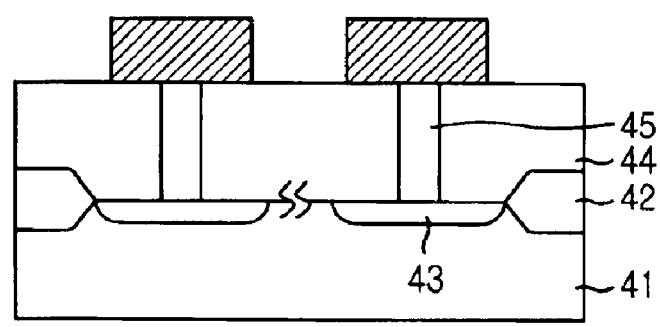
FIGS. 4A to 4F are cross-sectional views of a FeRAM device fabricated in accordance with a preferred embodiment of the present invention.

Referring to FIG. 4A, device isolation layers 42 for isolating each device are formed on a substrate 41 to thereby define active regions. Junction regions 43 such as a source/drain are formed in the active region of the substrate 41.

Next, a first inter-layer insulation layer 44 is deposited on the substrate 41 and is planarized thereafter. Afterwards, the first inter-layer insulation layer 44 is etched by using a contact mask to form storage node contact holes (not shown) exposing the junction regions 43.

A plurality of storage node contacts 45 buried into the storage node contact holes are formed. Each storage node contact 45 has a stack structure of a polysilicon plug, a titanium silicide layer and a titanium nitride layer, and detailed explanation on the step of forming this stack structure is omitted. Herein, the titanium silicide layer forms an ohmic contact between the polysilicon plug and a lower electrode. The titanium nitride layer is a diffusion barrier layer for preventing reciprocal diffusions between the polysilicon plug and the lower electrode.

A conductive layer for use in a lower electrode is deposited on the first inter-layer insulation layer 44, and a mask and etching process is applied thereto to form a plurality of lower electrodes 46 each being connected to the corresponding storage node contact 45.

At this time, the lower electrodes 46 are formed by performing one of a chemical vapor deposition (CVD) technique, a physical vapor deposition (PVD) technique, an atomic layer deposition (ALD) technique and a plasma enhanced (PE) ALD technique. Also, the lower electrode 46 is made of a material selected from a group consisting of platinum (Pt), iridium (Ir), ruthenium (Ru), rhenium (Re) and rhodium (Rh) and a complex structure of these listed materials. For instance, the lower electrode 46 has a stack structure of Pt, iridium oxide ($IrO_2$) and Ir. At this time, the Ir, the $IrO_2$ and the Pt are deposited to a thickness ranging from about 100 Å to about 3000 Å, from about 10 Å to about 500 Å and from about 100 Å to about 5000 Å, respectively.

Figure 4B:
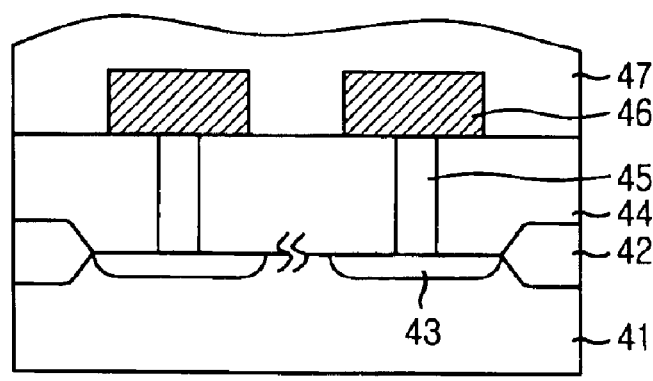

Referring to FIG. 4B, a second inter-layer insulation layer 47 is deposited on the above resulting structure including the lower electrodes 46 and the first inter-layer insulation layer 44. At this time, the second inter-layer insulation layer 47 is made of silicon oxide containing an impurity such as boron (B) or phosphorus (P). Such materials as phosphorus-silicate glass (PSG), boron-phosphorus-silicate glass (BPSG) and boron-silicate glass (BSG) are examples of such silicon oxide material.

Figure 4C:
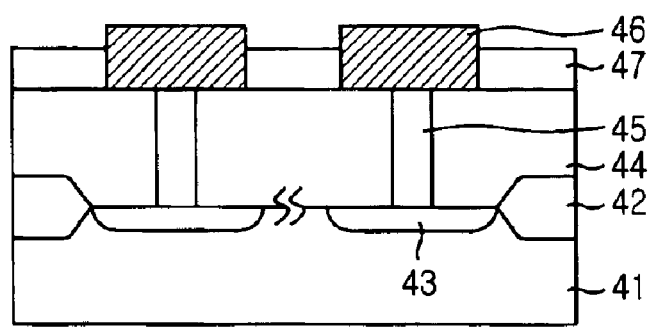

Referring to FIG. 4C, the second inter-layer insulation layer 47 is etched through a blanket etch-back process so that a surface of each lower electrode 46 is exposed. At this time, the remaining second inter-layer insulation layer 47 has a plane level lower than that of each lower electrode 46 so to isolate neighboring lower electrodes 46 from each other. That is, the remaining second inter-layer insulation layer 47 encompasses a bottom part of each lower electrode 46.

Figure 4D:
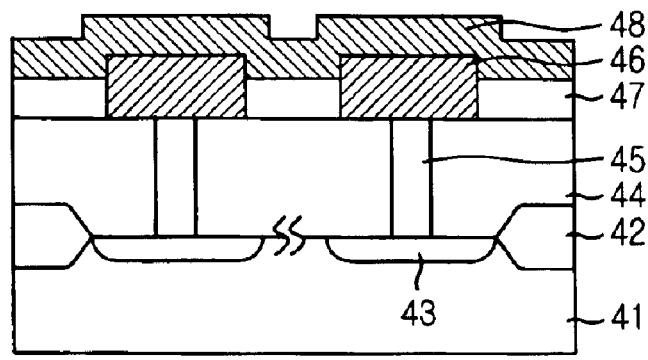

Referring to FIG. 4D, an impurity diffusion barrier layer 48 is formed on the first inter-layer insulation layer 47 and the lower electrodes 46. At this time, since the impurity diffusion barrier layer 48 is not deposited for the purpose of planarization, the deposition thickness of the impurity diffusion barrier layer 48 needs not to be thick. Thus, a subsequent blanket etch-back process can be easily applied to the impurity diffusion barrier layer 48.

For instance, the impurity diffusion barrier layer 48 is formed with one of silicon oxide containing no impurity, silicon nitride and a complex material of these two silicon oxide and silicon nitride. Herein, the silicon oxide containing no impurity is tetra-ethyl-ortho silicate (TEOS) or undoped silicate glass (USG). Also, the impurity diffusion barrier layer 48 is formed to a thickness ranging from about 1 nm to about 100 nm.

Figure 4E:
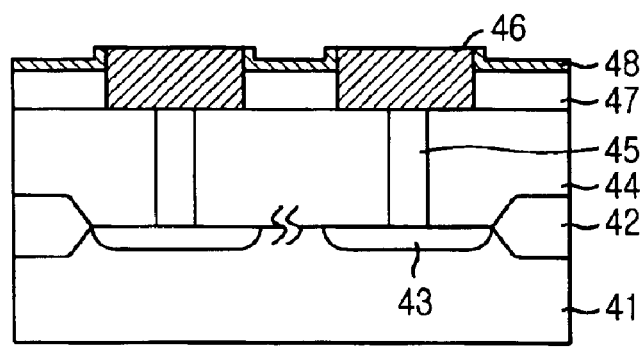

Referring to FIG. 4E, a blanket etch-back process is performed to the impurity diffusion barrier layer 48 until a surface of each lower electrode 46 is exposed. At this time, the remaining impurity diffusion barrier layer 48 encompasses an upper part of each lower electrode 46 by remaining on an upper part of the second inter-layer insulation layer 47.

Figure 4F:
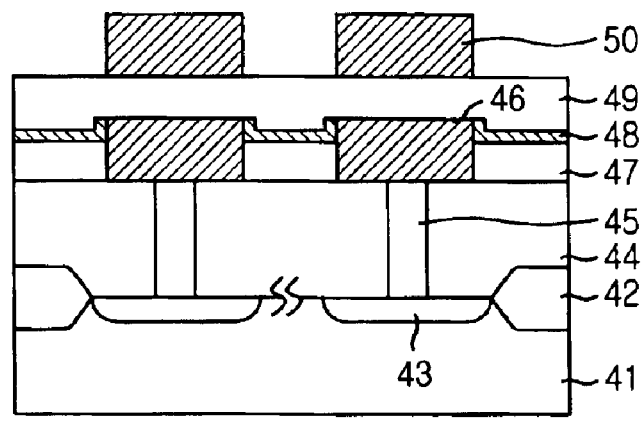

Referring to FIG. 4F, a ferroelectric layer 49 and a conductive layer for use in a top electrode are sequentially formed on an entire surface of the resulting structure including the impurity diffusion barrier layer 48. Then, the conductive layer is selectively etched to form top electrodes 50, completing formation of a ferroelectric capacitor.

At this time, the ferroelectric layer 49 is deposited by employing one of a chemical vapor deposition (CVD) technique, an atomic layer deposition (ALD) technique, a metal organic deposition (MOD) technique and a spin coating technique. Herein, the ferroelectric layer 49 is made of one of a material selected from a group consisting of strontium bismuth tantalate (SBT), lead zirconate titanate (PZT) and bismuth lanthanum titanate (BLT) and a material selected from a group consisting of SBT, PZT, BLT and strontium bismuth tantalum niobate (SBTN) each containing either an impurity or having a changed composition ratio. Meanwhile, the top electrodes 50 can be made of the same material for forming the lower electrodes 46.

After the formation of the ferroelectric layer 49, a thermal process is performed to crystallize the ferroelectric layer 49 based on the known technology. Since the ferroelectric layer 49 is formed on such a structure including buried lower electrodes 46 and is planarized prior to forming the top electrodes 50, it is easier to obtain the planarized structure along with subsequent processes.

As described above, the blanket etch-back process makes it possible to expose the surface of each lower electrode without damaging the impurity diffusion barrier layer 48. Since the impurity diffusion barrier layer 48 still remains on the second inter-layer insulation layer 47, there does not occur degradation of the ferroelectric layer 49 caused by diffusions of the impurity contained in the second inter-layer insulation layer 47. Also, it is not necessary to employ relatively expensive chemical mechanical polishing (CMP) process to form the impurity diffusion barrier layer 48.

According to the preferred embodiment of the present invention, the impurity diffusion barrier layer is formed on between the second inter-layer insulation layer and the ferroelectric layer so to prevent diffusions of the impurity contained in the second inter-layer insulation layer encompassing the lower electrodes. As a result, it is possible to secure process stability by suppressing the degradation of the ferroelectric characteristics of the ferroelectric capacitor and simultaneously to improve reliability on the ferroelectric memory device. Also, it is not necessary to perform the CMP process so as to reduce manufacturing costs.

While the present invention has been described with respect to certain preferred embodiments, it will be apparent to those skilled in the art that various changes and modifications may be made without departing from the scope of the invention as defined in the following claims.

What is claimed is:

1. A method for fabricating a ferroelectric random access memory device, comprising the steps of:

forming a first inter-layer insulation layer on a substrate;

forming a storage node contact by passing through the first inter-layer insulation layer;

forming a lower electrode connected to the storage node contact on the first inter-layer insulation layer;

forming a second inter-layer insulation layer having a surface level lower than that of the lower electrode by depositing a first insulation layer on the first inter-layer insulation layer and the lower electrode and performing a blanket etch-back process to the first insulation layer until a surface of the lower electrode is exposed;

forming an impurity diffusion barrier layer encompassing upper side walls of the lower electrode on the second inter-layer insulation layer;

forming a ferroelectric layer on the lower electrode and the impurity diffusion barrier layer; and forming a top electrode on the ferroelectric layer.

2. The method as recited in claim 1, wherein the first insulation layer is made of a material such as boron-phosphorus-silicate glass (BPSG), phosphorus-silicate glass (PSG) and boron-silicate glass (BSG).

3. The method as recited in claim 1, wherein the step of forming the impurity diffusion barrier layer includes the steps of:

depositing a second insulation layer on an entire surface of a structure including the second inter-layer insulation layer; and performing an blanket etch-back process to the second insulation layer until a surface of the lower electrode is exposed.

4. The method as recited in claim 3, wherein the second insulation layer is formed with one of a material such as silicon oxide containing no impurity, silicon nitride and a complex material of these two silicon oxide and silicon nitride.

5. The method as recited in claim 4, wherein the silicon oxide containing no impurity is one of tetra-ethyl-ortho silicate (TEOS) and undoped silicate glass (USG).

6. The method as recited in claim 3, wherein the second insulation layer is deposited to a thickness ranging from about 1 nm to about 100 nm.

7. The method as recited in claim 1, wherein the second inter-layer insulation layer encompasses a bottom part of the lower electrode.

* * * * *